(12) United States Patent
Zhou et al.

(10) Patent No.: US 12,136,793 B2
(45) Date of Patent: *Nov. 5, 2024

(54) LENS ARRANGEMENTS FOR VARYING NUMERICAL APERTURE IN LASER DELIVERY SYSTEMS

(71) Applicant: PANASONIC INTELLECTUAL PROPERTY MANAGEMENT CO., LTD, Osaka (JP)

(72) Inventors: Wang-Long Zhou, Andover, MA (US); Francisco Villarreal-Saucedo, Middleton, MA (US)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/198,952

(22) Filed: May 18, 2023

(65) Prior Publication Data
US 2023/0291166 A1  Sep. 14, 2023

Related U.S. Application Data

(63) Continuation of application No. 16/137,691, filed on Sep. 21, 2018, now Pat. No. 11,695,247.
(Continued)

(51) Int. Cl.
B23K 26/064 (2014.01)
B23K 26/06 (2014.01)
(Continued)

(52) U.S. Cl.
CPC ...... *H01S 3/094042* (2013.01); *B23K 26/064* (2015.10); *B23K 26/0648* (2013.01);
(Continued)

(58) Field of Classification Search
CPC .. H01S 3/094042; H01S 3/005; H01S 3/0071; H01S 3/093; H01S 5/4062;
(Continued)

(56) References Cited

U.S. PATENT DOCUMENTS

| | | | | |
|---|---|---|---|---|
| 5,081,639 A | * | 1/1992 | Snyder | G02B 6/4206 359/720 |
| 5,237,367 A | * | 8/1993 | Kudo | G03F 7/70075 362/268 |

(Continued)

FOREIGN PATENT DOCUMENTS

| | | |
|---|---|---|
| JP | 9-10981 A | 1/1997 |
| JP | 2009-226473 A | 10/2009 |
| JP | 2009-294473 A | 12/2009 |

OTHER PUBLICATIONS

International Search Report and Written Opinion for International Application No. PCT/IB2018/001163 dated Jan. 15, 2019 16 pages.

*Primary Examiner* — Xinning(Tom) Niu
(74) *Attorney, Agent, or Firm* — Morgan, Lewis & Bockius LLP

(57) ABSTRACT

In various embodiments, one or more optical elements are utilized to alter the numerical aperture of a radiation beam received from an optical fiber in order to accommodate the properties of a downstream collimator within a laser delivery head.

19 Claims, 9 Drawing Sheets

Related U.S. Application Data

(60) Provisional application No. 62/561,263, filed on Sep. 21, 2017.

(51) Int. Cl.
| | | |
|---|---|---|
| *B23K 26/21* | (2014.01) | |
| *B23K 26/38* | (2014.01) | |
| *F21V 8/00* | (2006.01) | |
| *G02B 27/09* | (2006.01) | |
| *H01S 3/00* | (2006.01) | |
| *H01S 3/093* | (2006.01) | |
| *H01S 3/094* | (2006.01) | |
| *H01S 5/40* | (2006.01) | |
| *G02B 6/42* | (2006.01) | |
| *G02B 27/30* | (2006.01) | |
| *H01S 5/026* | (2006.01) | |
| *H01S 5/14* | (2006.01) | |

(52) U.S. Cl.
CPC .............. *B23K 26/21* (2015.10); *B23K 26/38* (2013.01); *G02B 6/0006* (2013.01); *G02B 27/0955* (2013.01); *H01S 3/005* (2013.01); *H01S 3/0071* (2013.01); *H01S 3/093* (2013.01); *H01S 5/4062* (2013.01); *G02B 6/4296* (2013.01); *G02B 27/30* (2013.01); *H01S 5/026* (2013.01); *H01S 5/143* (2013.01); *H01S 5/4031* (2013.01); *H01S 5/4068* (2013.01)

(58) Field of Classification Search
CPC ........ H01S 5/026; H01S 5/143; H01S 5/4031; H01S 5/4068; B23K 26/064; B23K 26/0648; B23K 26/21; B23K 26/38; G02B 6/0006; G02B 27/0955; G02B 6/4296; G02B 27/30
See application file for complete search history.

(56) References Cited

U.S. PATENT DOCUMENTS

| | | | | |
|---|---|---|---|---|
| 5,805,748 | A * | 9/1998 | Izawa | ............... G02B 27/0966 |
| | | | | 372/71 |
| 11,695,247 | B2 * | 7/2023 | Zhou | ...................... H01S 3/005 |
| | | | | 359/341.1 |
| 2002/0047992 | A1 * | 4/2002 | Graves | .................. G02B 26/06 |
| | | | | 351/212 |
| 2004/0238504 | A1 | 12/2004 | Aubry | |
| 2005/0257708 | A1 * | 11/2005 | Sousa | .................... B23K 26/36 |
| | | | | 101/467 |
| 2012/0105968 | A1 * | 5/2012 | Chann | ............... G02B 27/0905 |
| | | | | 359/634 |
| 2015/0185492 | A1 * | 7/2015 | Nagano | ............. G02B 19/0014 |
| | | | | 359/641 |
| 2016/0103328 | A1 * | 4/2016 | Heinrich | ........... G02B 19/0014 |
| | | | | 359/809 |
| 2016/0377874 | A1 * | 12/2016 | Zhou | ..................... G02B 7/005 |
| | | | | 359/569 |

* cited by examiner

LENS ARRANGEMENTS FOR VARYING NUMERICAL APERTURE IN LASER DELIVERY SYSTEMS

RELATED APPLICATIONS

This application is a continuation of U.S. patent application Ser. No. 16/137,691, filed Sep. 21, 2018, which claims the benefit of and priority to U.S. Provisional Patent Application No. 62/561,263, filed Sep. 21, 2017, the entire disclosure of each of which is hereby incorporated herein by reference.

TECHNICAL FIELD

In various embodiments, the present invention relates to laser systems, specifically laser systems with controllable numerical apertures.

BACKGROUND

With the development of high power lasers, laser material processing is now being used as part of the production for many commercial products. In many laser application processes such as cutting, welding, drilling and marking, output power and beam quality may vary in order to obtain high process yield and good finishing quality that depend on the type of processing and/or the type of material being processed. The laser beam quality is normally characterized as how tightly a laser beam can be focused with a limited beam divergence and is quantified by the beam parameter product (BPP), $M^2$ factor, and inverse $M^2$ factor. The BPP is the product of the laser beam's divergence angle (half-angle) and the radius of the beam at its narrowest point (i.e., the beam waist, the minimum spot size) in units of millimeter-milliradian (mm·mrad). Focusing a high-power laser beam onto the workpiece with a small beam waist and a low divergence angle may lead to gain in speed and quality in applications such as laser cutting of metals. A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

A high-power laser fiber delivery system typically features a fiber cable and a laser head. The fiber cable delivers laser power from a system producing the laser beam (i.e., a beam source) to the laser head, and the laser head collimates the laser beam exiting from the fiber and focuses the laser beam onto a workpiece. When connecting or pairing the fiber cable and laser head together, one major consideration is the maximum acceptable numerical aperture (NA) of the laser head, which characterizes the range of angles over which the laser head can emit light. The laser head typically features a collimator and a focusing lens or lens system. The focal length (f) and the clear aperture ($\Phi$) (i.e., the light-gathering area) of the collimator determine the acceptable NA ($=\Phi/f/2$) of the laser head, assuming the optics downstream of the collimator have the same or larger clear aperture. Equivalently, the NA of the collimator may be expressed as n×sin(a), where n is the index of refraction of the medium in which the collimator is disposed (n=1 for free space/air), and a is the maximal half-angle of the cone of light that can enter or exit the collimator (i.e., one-half of the angular aperture or capture angle).

The fiber cable typically contains one or more optical fibers. Optical fibers typically have a design, or rated, NA (e.g., 0.22) that caps the maximum input and output NA of the fiber. The actual output NA of the fiber is typically determined mainly by the input NA and the refractive index profile of the fiber. Exceptions may occur when the input NA is very small (e.g., less than 0.05), due to other effects such as fiber bending, defects, optical disturbances, etc.

Driven by the demand of multiple applications, the capability to adjust the BPP of the output beam has grown more desirable. Since BPP is the product of NA and the spot size of the laser beam, varying BPP may be accomplished by varying NA, spot size, or both. Therefore, a laser head receiving a BPP-varying laser beam will typically need a collimator of shorter focal length to accommodate the maximum possible NA of the incoming laser beam. The most widely used laser head collimator has 100 mm focal length and a clear aperture of approximately 26-28 mm, which results a maximum acceptable NA of about 0.13-0.14. If the maximum NA of an incoming laser beam, including fiber exit pointing error, is (or potentially is) larger than the maximum acceptable NA of the laser head equipped with a collimator of 100 mm focal length, then a collimator of shorter focal length, such as 75 mm or 60 mm, etc., will typically be used to replace the original collimator, otherwise a high risk of damage to the laser head or even the entire laser delivery system may result. However, replacing the collimator of a laser head in the field after a laser system is deployed is not desirable, because it requires very careful handling by trained person under optical clean room conditions. Moreover, the collimator replacement process will inevitably increase the chances of introducing particulates and dust into the laser head and, therefore, increase the risk of damaging the laser head. In addition, the switching of collimators requires the stocking of multiple different collimators in inventory, which results in higher costs. Replacement of collimators may also be quite difficult and costly.

In view of the foregoing, there is a need for techniques and apparatus for altering the NA of a laser beam in a laser delivery system (and, optionally, the spot size and/or output NA of the resulting output beam at a workpiece) without requiring replacement of the collimator in the laser head.

SUMMARY

Systems and techniques in accordance with embodiments of the present invention obviate the need to replace the collimator of a laser head of a laser delivery system by utilizing a lens at the exit of the laser delivery fiber. The lens may reduce the NA of the laser beam traveling to the collimator of the laser head and may also serve as a protective window for the delivery fiber. As a result, the laser head will accept laser beams having higher NA without requiring costly and time-consuming changes to the collimator in the laser head. In various embodiments, only translation of the collimator (e.g., along the beam-propagation direction) is utilized to compensate for the presence of the lens. The translation of the collimator may also enable adjustment of the NA of the output beam (and, at the same time, the spot size of the output beam), as desired for a particular application (e.g., materials processing technique) and/or type of material being processed by the output beam. For example, different NAs or spot sizes may be preferred for cutting a thin metal compared to cutting through thicker metals.

As utilized herein, changing the "shape" of a laser beam refers to altering the shape and geometric extent of the beam (e.g., at a point at which the beam intersects a surface). Changes in shape may be accompanied by changes in beam size, angular intensity distribution of the beam, and BPP, but mere changes in beam BPP are not necessarily sufficient to change laser beam shape and vice versa.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art. In addition, references to "lasers," "laser emitters," or "beam emitters" herein include not only single-diode lasers, but also diode bars, laser arrays, diode bar arrays, and single or arrays of vertical cavity surface-emitting lasers (VCSELs).

Output beams produced in accordance with embodiments of the present invention may be utilized to process a workpiece such that the surface of the workpiece is physically altered and/or such that a feature is formed on or within the surface, in contrast with optical techniques that merely probe a surface with light (e.g., reflectivity measurements). Exemplary processes in accordance with embodiments of the invention include cutting, welding, drilling, and soldering. Various embodiments of the invention may also process workpieces at one or more spots or along a one-dimensional linear or curvilinear processing path, rather than flooding all or substantially all of the workpiece surface with radiation from the laser beam. Such one-dimensional paths may be composed of multiple segments, each of which may be linear or curvilinear.

One advantage of variable shape and/or BPP is improved laser application performance for different types of processing techniques or different types of materials being processed. Embodiments of the invention may also utilize various techniques for varying BPP and/or shape of laser beams described in U.S. patent application Ser. No. 14/632,283, filed on Feb. 26, 2015, U.S. patent application Ser. No. 14/747,073, filed Jun. 23, 2015, U.S. patent application Ser. No. 14/852,939, filed Sep. 14, 2015, U.S. patent application Ser. No. 15/188,076, filed Jun. 21, 2016, U.S. patent application Ser. No. 15/479,745, filed Apr. 5, 2017, and U.S. patent application Ser. No. 15/649,841, filed Jul. 14, 2017, the disclosure of each of which is incorporated in its entirety herein by reference.

Embodiments of the invention may be utilized with wavelength beam combining (WBC) systems that include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein. Multi-wavelength output beams of WBC systems may be utilized as input beams in conjunction with embodiments of the present invention for, e.g., NA, BPP, and/or beam shape control.

In an aspect, embodiments of the invention feature a laser delivery system for directing optical radiation onto a workpiece. The system includes, consists essentially of, or consists of an optical fiber, a laser delivery head coupled to the optical fiber, and an optical element. The optical fiber is configured to emit, at a fiber exit plane, a radiation beam having a numerical aperture ranging from a first numerical aperture to a second numerical aperture larger than the first numerical aperture. The laser delivery head is configured to receive the radiation beam and containing a collimator having a third numerical aperture less than the second numerical aperture. The optical element is disposed optically downstream of the fiber exit plane and optically upstream of the collimator. The optical element has positive optical power and is configured to reduce the numerical aperture of the radiation beam to a value less than the third numerical aperture.

Embodiments of the invention may include one or more of the following in any of a variety of combinations. The collimator may be translatable, within the laser delivery head, in a direction parallel to a propagation path of the radiation beam within the laser delivery head. The laser delivery head may include focusing optics for focusing the radiation beam onto the workpiece. The focusing optics may be disposed optically downstream of and distinct from the collimator. The optical element may include, consist essentially of, or consist of a lens having a center thickness less than approximately 5 mm. The optical element may include, consist essentially of, or consist of a lens having a center thickness greater than approximately 5 mm. The optical element may include, consist essentially of, or consist of a lens having a center thickness greater than approximately 10 mm. The optical element may include, consist essentially of, or consist of an end cap having a flat entrance surface and, opposite the entrance surface, a curved exit surface. The optical element may include, consist essentially of, or consist of (i) a lens and (ii) a transparent block having a flat entrance surface and a flat exit surface opposite the entrance surface. These conditions may be satisfied: (i) s(R−1)=t(n−1)/n, (ii) s is an effective optical distance between the optical element and the fiber exit plane, (iii) R=$f_1$/EFL, (iv) $f_1$ is a focal length of the collimator, (v) $f_2$ is a focal length of the optical element, (vi) d is a distance (e.g., an optical distance) between the optical element and the collimator, (vii)

$$\frac{1}{EFL} = \frac{1}{f_1} + \frac{1}{f_2} - \frac{d}{(f_1 \times f_2)},$$

(viii) t is a thickness of the optical element, and (ix) n is a refractive index of the optical element.

The system may include a beam source for supplying the radiation beam to the optical fiber. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a method of processing a workpiece. A laser delivery head is provided. The laser delivery head includes, consists essentially of, or consists of a collimator having a first numerical aperture. A radiation beam is emitted from the optical fiber. The radiation beam has a numerical aperture larger than the first numerical aperture. The numerical aperture of the radiation beam is reduced, optically downstream of the optical fiber and optically upstream of the collimator, to a value no greater than the first numerical aperture. The radiation beam is at least partially collimated with the collimator. Thereafter, the radiation beam is directed onto a workpiece.

Embodiments of the invention may include one or more of the following in any of a variety of combinations. The collimator may be translated within the laser delivery head to compensate for the numerical aperture reduction. The optical fiber may be configured to emit radiation beams having numerical apertures ranging from a second numerical aperture to a third numerical aperture larger than the first and second numerical apertures. The second numerical aperture may be greater than or less than the first numerical aperture. The laser delivery head may include focusing optics for focusing the radiation beam onto the workpiece. The focusing optics may be disposed optically downstream of and distinct from the collimator.

The numerical aperture of the radiation beam may be reduced via an optical element having positive optical power. The optical element may include, consist essentially of, or consist of a lens having a center thickness less than approximately 5 mm. The optical element may include, consist essentially of, or consist of a lens having a center thickness greater than approximately 5 mm. The optical element may include, consist essentially of, or consist of a lens having a center thickness greater than approximately 10 mm. The optical element may include, consist essentially of, or consist of an end cap having a flat entrance surface and, opposite the entrance surface, a curved exit surface. The optical element may include, consist essentially of, or consist of (i) a lens and (ii) a transparent block having a flat entrance surface and a flat exit surface opposite the entrance surface. These conditions may be satisfied: (i) s(R−1)=t(n−1)/n, (ii) s is an effective optical distance between the optical element and a fiber exit plane of the optical fiber, (iii) R=$f_1$/EFL, (iv) $f_1$ is a focal length of the collimator, (v) $f_2$ is a focal length of the optical element, (vi) d is a distance (e.g., an optical distance) between the optical element and the collimator, (vii)

$$\frac{1}{EFL} = \frac{1}{f_1} + \frac{1}{f_2} - \frac{d}{(f_1 \times f_2)},$$

(viii) t is a thickness of the optical element, and (ix) n is a refractive index of the optical element.

The collimator may be translated within the laser delivery head to compensate for the numerical aperture reduction. The collimator may be translated by a distance Z=s(R−1), where (i) s is an effective optical distance between the optical element and a fiber exit plane of the optical fiber, (ii) R=$f_1$/EFL, (iii) $f_1$ is a focal length of the collimator, (iv) $f_2$ is a focal length of the optical element, (v) d is a distance (e.g., an optical distance) between the optical element and the collimator, and (vi)

$$\frac{1}{EFL} = \frac{1}{f_1} + \frac{1}{f_2} - \frac{d}{(f_1 \times f_2)}.$$

The radiation beam may be supplied to the optical fiber from a beam source. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In yet another aspect, embodiments of the invention feature a laser delivery system for directing optical radiation onto a workpiece from an optical fiber configured to emit, at a fiber exit plane, a radiation beam having a numerical aperture ranging from a first numerical aperture to a second numerical aperture larger than the first numerical aperture. The system includes, consists essentially of, or consists of a laser delivery head configured to receive the radiation beam from the optical fiber and containing a collimator having a third numerical aperture less than the second numerical aperture, and disposed optically upstream of the collimator, an optical element having positive optical power and configured to reduce the numerical aperture of the radiation beam to a value less than the third numerical aperture.

Embodiments of the invention may include one or more of the following in any of a variety of combinations. The collimator may be translatable, within the laser delivery head, in a direction parallel to a propagation path of the radiation beam within the laser delivery head. The laser delivery head may include focusing optics for focusing the radiation beam onto the workpiece. The focusing optics may be disposed optically downstream of and distinct from the collimator. The optical element may include, consist essentially of, or consist of a lens having a center thickness less than approximately 5 mm. The optical element may include, consist essentially of, or consist of a lens having a center thickness greater than approximately 5 mm. The optical element may include, consist essentially of, or consist of a lens having a center thickness greater than approximately 10 mm. The optical element may include, consist essentially of, or consist of an end cap having a flat entrance surface and, opposite the entrance surface, a curved exit surface. The optical element may include, consist essentially of, or consist of (i) a lens and (ii) a transparent block having a flat entrance surface and a flat exit surface opposite the entrance surface. These conditions may be satisfied: (i) s(R−1)=t(n−1)/n, (ii) s is an effective optical distance between the optical element and the fiber exit plane, (iii) R=$f_1$/EFL, (iv) $f_1$ is a focal length of the collimator, (v) $f_2$ is a focal length of the optical element, (vi) d is a distance (e.g., an optical distance) between the optical element and the collimator, (vii)

$$\frac{1}{EFL} = \frac{1}{f_1} + \frac{1}{f_2} - \frac{d}{(f_1 \times f_2)},$$

(viii) t is a thickness of the optical element, and (ix) n is a refractive index of the optical element.

The system may include a beam source for supplying the radiation beam to the optical fiber. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a laser delivery system for receiving and altering a numerical aperture of a radiation beam emitted by a beam source and focusing the radiation with the altered numerical aperture onto a workpiece. The system includes, consists essentially of, or consists of an optical fiber, an end cap, a lens, and a laser delivery head. The optical fiber transmits the radiation beam from the beam source to a fiber exit plane. The end cap is disposed at the fiber exit plane. The end cap receives the radiation beam from the optical fiber. The end cap has a flat entrance surface and a flat exit surface opposed to and spaced apart from the entrance surface. The lens is distinct from and disposed optically downstream of the exit surface of the end cap. The lens has a positive optical power. The laser delivery head is positioned to receive the radiation beam. The laser delivery head includes, consists essentially of, or consists of (i) a collimator for collimating the radiation beam, and (ii) disposed optically downstream of and distinct from the collimator, focusing optics for focusing the radiation beam onto the workpiece.

Embodiments of the invention may include one or more of the following in any of a variety of combinations. The collimator may be translatable, within the laser delivery head, in a direction parallel to a propagation path of the radiation beam within the laser delivery head. The center thickness of the lens may be greater than approximately 5 mm or greater than approximately 10 mm. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In yet another aspect, embodiments of the invention feature a laser delivery system for receiving and altering a numerical aperture of a radiation beam emitted by a beam source and focusing the radiation with the altered numerical aperture onto a workpiece. The system includes, consists essentially of, or consists of an optical fiber for transmitting the radiation beam from the beam source to a fiber exit plane, an end cap for receiving the radiation beam from the optical fiber, and a laser delivery head positioned to receive the radiation beam. The end cap is disposed at the fiber exit plane. The end cap has a flat entrance surface and an exit surface (i) opposed to and spaced apart from the entrance surface and (ii) having a positive optical power. The laser delivery head includes, consists essentially of, or consists of (i) a collimator for collimating the radiation beam, and (ii) disposed optically downstream of and distinct from the collimator, focusing optics for focusing the radiation beam onto the workpiece.

Embodiments of the invention may include one or more of the following in any of a variety of combinations. The collimator may be translatable, within the laser delivery head, in a direction parallel to a propagation path of the radiation beam within the laser delivery head. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a method of modifying a laser delivery system. The laser delivery system includes, consists essentially of, or consists of (i) an optical fiber for transmitting a radiation beam emitted by a beam source to a fiber exit plane, and (ii) a laser delivery head for receiving the radiation beam from the optical fiber. The laser delivery head includes, consists essentially of, or consists of a collimator for collimating the radiation beam. The laser delivery head is configured to accept a radiation beam having a numerical aperture no greater than a maximum numerical aperture. The beam source is configured to supply a radiation beam having a numerical aperture greater than the maximum numerical aperture. A lens having a positive optical power is disposed optically downstream of the fiber exit plane without replacing the collimator in the laser delivery head. The lens is configured to receive the radiation beam and reduce the numerical aperture thereof to a numerical aperture no greater than the maximum numerical aperture. Within the laser delivery head, the collimator is translated in a direction parallel to a propagation direction within the laser delivery head and toward the fiber exit surface to thereby compensate for the lens.

Embodiments of the invention may include one or more of the following in any of a variety of combinations. The center thickness of the lens may be less than approximately 5 mm. The collimator may be translated by a distance $Z=s(R-1)$, where (i) s is an effective optical distance between the optical element and the fiber exit plane, (ii) $R=f_1/EFL$, (iii) $f_1$ is a focal length of the collimator, (iv) $f_2$ is a focal length of the lens, (v) d is a distance (e.g., an optical distance) between the lens and the collimator, and (vi)

$$\frac{1}{EFL} = \frac{1}{f_1} + \frac{1}{f_2} - \frac{d}{(f_1 \times f_2)}.$$

The laser delivery system may include an end cap for receiving the radiation beam from the optical fiber at the fiber exit plane. The end cap may have a flat entrance surface and, spaced apart from the entrance surface, a flat exit surface. The laser delivery head may include focusing optics for focusing the radiation beam onto a workpiece. The focusing optics may be disposed optically downstream of the collimator. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In yet another aspect, embodiments of the invention feature a method of modifying a laser delivery system. The laser delivery system includes, consists essentially of, or consists of (i) an optical fiber for transmitting a radiation beam emitted by a beam source to a fiber exit plane, (ii) an end cap for receiving the radiation beam from the optical fiber, the end cap having a flat entrance surface and, spaced apart from the entrance surface, a flat exit surface, and (iii) a laser delivery head for receiving the radiation beam. The laser delivery head includes, consists essentially of, or consists of a collimator for collimating the radiation beam. The laser delivery head is configured to accept a radiation beam having a numerical aperture not greater than a maximum numerical aperture. The beam source is configured to supply a radiation beam having a numerical aperture greater than the maximum numerical aperture. The end cap is replaced with a lensed end cap without replacing the collimator in the laser delivery head. The lensed end cap has (i) a flat entrance surface and (ii) an exit surface spaced apart from the entrance surface and having a positive optical power optically downstream of the entrance surface. The lensed end cap is configured to receive the radiation beam and reduce the numerical aperture thereof to a numerical aperture no greater than the maximum numerical aperture. Within the laser delivery head, the collimator is translated in a direction parallel to a propagation direction within the laser delivery head and toward the fiber exit surface to thereby compensate for the lensed end cap.

Embodiments of the invention may include one or more of the following in any of a variety of combinations. The collimator may be translated by a distance $Z=s(R-1)$, where (i) s is an effective optical distance between the optical element and the fiber exit plane, (ii) $R=f_1/EFL$, (iii) $f_1$ is a focal length of the collimator, (iv) $f_2$ is a focal length of the exit surface of the lensed end cap, (v) d is a distance (e.g., an optical distance) between the lensed end cap and the collimator, and (vi)

$$\frac{1}{EFL} = \frac{1}{f_1} + \frac{1}{f_2} - \frac{d}{(f_1 \times f_2)}.$$

The laser delivery head may include focusing optics for focusing the radiation beam onto a workpiece. The focusing optics may be disposed optically downstream of the collimator. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In another aspect, embodiments of the invention feature a method of modifying a laser delivery system. The laser delivery system includes, consists essentially of, or consists of (i) an optical fiber for transmitting a radiation beam emitted by a beam source to a fiber exit plane, and (ii) a laser delivery head for receiving the radiation beam from the optical fiber. The laser delivery head includes, consists essentially of, or consists of a collimator for collimating the radiation beam. The laser delivery head is configured to accept a radiation beam having a numerical aperture no greater than a maximum numerical aperture. The beam source is configured to supply a radiation beam having a numerical aperture greater than the maximum numerical aperture. A lens is disposed optically downstream of the end cap without replacing the collimator in the laser delivery head. The lens (i) has a positive optical power, (ii) has a center thickness larger than 5 mm, and (iii) is configured to receive the radiation beam and reduce the numerical aperture thereof to a numerical aperture no greater than the maximum numerical aperture. Within the laser delivery head, an optical distance between the collimator and the fiber exit surface is maintained substantially unchanged notwithstanding the reduction of the numerical aperture of the radiation beam and the presence of the lens.

Embodiments of the invention may include one or more of the following in any of a variety of combinations. These conditions may be satisfied: (i) $s(R-1)=t(n-1)/n$, (ii) s is an effective optical distance between the optical element and the fiber exit plane, (iii) $R=f_1/EFL$, (iv) $f_1$ is a focal length of the collimator, (v) $f_2$ is a focal length of the lens, (vi) d is a distance (e.g., an optical distance) between the lens and the collimator, (vii)

$$\frac{1}{EFL} = \frac{1}{f_1} + \frac{1}{f_2} - \frac{d}{(f_1 \times f_2)},$$

(viii) t is a thickness of the lens, and (ix) n is a refractive index of the lens. The laser delivery system may include an end cap for receiving the radiation beam from the optical fiber at the fiber exit plane. The end cap may have a flat entrance surface and, spaced apart from the entrance surface, a flat exit surface. The laser delivery head may include focusing optics for focusing the radiation beam onto a workpiece. The focusing optics may be disposed optically downstream of the collimator. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

In yet another aspect, embodiments of the invention feature a method of processing a workpiece. A laser delivery head coupled to an optical fiber is provided. The laser delivery head includes, consists essentially of, or consists of a collimator having a first numerical aperture. a radiation beam having a numerical aperture larger than the first numerical aperture is emitted from the optical fiber. The numerical aperture of the radiation beam is reduced, optically downstream of the optical fiber and optically upstream of the collimator, to a value no greater than the first numerical aperture. The radiation beam is at least partially collimated (i.e., partially or substantially fully collimated) with the collimator. Thereafter, the workpiece is processed with the radiation beam.

Embodiments of the invention may include one or more of the following in any of a variety of combinations. Before and/or during processing the workpiece, the collimator may be translated within the laser delivery head to adjust a numerical aperture of the radiation beam at the workpiece. The numerical aperture of the radiation beam may be adjusted based on at least one characteristic of the workpiece. The at least one characteristic of the workpiece may include, consist essentially of, or consist of a thickness of the workpiece and/or a composition of the workpiece. Processing the workpiece may include, consist essentially of, or consist of physically altering at least a portion of a surface of the workpiece. Processing the workpiece may include, consist essentially of, or consist of cutting, welding, etching, annealing, drilling, soldering, and/or brazing. The collimator may be translated within the laser delivery head to compensate for the numerical aperture reduction (e.g., before the processing). The optical fiber may be configured to emit radiation beams having numerical apertures ranging from a second numerical aperture to a third numerical aperture larger than the first and second numerical apertures. The second numerical aperture may be greater than or less than the first numerical aperture.

In another aspect, embodiments of the invention feature a method of processing a workpiece utilizing a laser delivery system. The laser delivery system includes, consists essentially of, or consists of (i) an optical fiber configured to emit, at a fiber exit plane, a radiation beam having a numerical aperture ranging from a first numerical aperture to a second numerical aperture larger than the first numerical aperture, (ii) coupled to the optical fiber, a laser delivery head configured to receive the radiation beam and containing a collimator having a third numerical aperture less than the second numerical aperture, and (iii) disposed optically downstream of the fiber exit plane and optically upstream of the collimator, an optical element having positive optical power and configured to reduce the numerical aperture of the radiation beam to a value less than the third numerical aperture. The radiation beam is emitted from the laser delivery head. The radiation beam has a numerical aperture less than the third numerical aperture. A workpiece is processed with the radiation beam.

Embodiments of the invention may include one or more of the following in any of a variety of combinations. Before and/or during processing the workpiece, the collimator may be translated within the laser delivery head to adjust a numerical aperture of the radiation beam at the workpiece. The numerical aperture of the radiation beam may be adjusted based on at least one characteristic of the workpiece. The at least one characteristic of the workpiece may include, consist essentially of, or consist of a thickness of the workpiece and/or a composition of the workpiece. Processing the workpiece may include, consist essentially of, or consist of physically altering at least a portion of a surface of the workpiece. Processing the workpiece may include, consist essentially of, or consist of cutting, welding, etching, annealing, drilling, soldering, and/or brazing. The collimator may be translated within the laser delivery head to compensate for the optical element. The collimator may be translated before emitting the radiation beam from the laser delivery head. The collimator may be translated by a distance $Z=s(R-1)$, where (i) s is an effective optical distance between the optical element and the fiber exit plane of the optical fiber, (ii) $R=f_1/EFL$, (iii) $f_1$ is a focal length of the collimator, (iv) $f_2$ is a focal length of the optical element, (v) d is a distance (e.g., an optical distance) between the optical element and the collimator, and (vi)

$$\frac{1}{EFL} = \frac{1}{f_1} + \frac{1}{f_2} - \frac{d}{(f_1 \times f_2)}.$$

These conditions may be satisfied: (i) $s(R-1)=t(n-1)/n$, (ii) s is an effective optical distance between the optical element and the fiber exit plane, (iii) $R=f_1/EFL$, (iv) $f_1$ is a focal length of the collimator, (v) $f_2$ is a focal length of the optical element, (vi) d is a distance (e.g., an optical distance) between the optical element and the collimator, (vii)

$$\frac{1}{EFL} = \frac{1}{f_1} + \frac{1}{f_2} - \frac{d}{(f_1 \times f_2)},$$

(viii) t is a thickness of the optical element, and (ix) n is a refractive index of the optical element.

The radiation beam may be supplied from a beam source. The beam source may include, consist essentially of, or consist of one or more radiation sources emitting a plurality of discrete beams, focusing optics for focusing the plurality of beams onto a dispersive element, a dispersive element for receiving and dispersing the received focused beams, and a partially reflective output coupler positioned to receive the dispersed beams, transmit a portion of the dispersed beams therethrough as the radiation beam, and reflect a second portion of the dispersed beams back toward the dispersive element. The radiation beam may be composed of multiple wavelengths. Each of the discrete beams may have a different wavelength. The second portion of the dispersed beams may propagate back to the one or more beam sources to thereby stabilize the beams to their emission wavelengths. The focusing optics may include or consist essentially of one or more cylindrical lenses, one or more spherical lenses, one or more spherical mirrors, and/or one or more cylindrical mirrors. The dispersive element may include, consist essentially of, or consist of one or more diffraction gratings (e.g., one or more transmissive gratings and/or one or more reflective gratings), one or more dispersive fibers, and/or one or more prisms.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated. Herein, "downstream" or "optically downstream," is utilized to indicate the relative placement of a second element that a light beam strikes after encountering a first element, the first element being "upstream," or "optically upstream" of the second element. Herein, "optical distance" between two components is the distance between two components that is actually traveled by light beams; the optical distance may be, but is not necessarily, equal to the physical distance between two components due to, e.g., reflections from mirrors or other changes in propagation direction experienced by the light traveling from one of the components to the other. "Distances" utilized herein may be considered to be "optical distances" unless otherwise specified.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which.

DETAILED DESCRIPTION

Figure 1A:
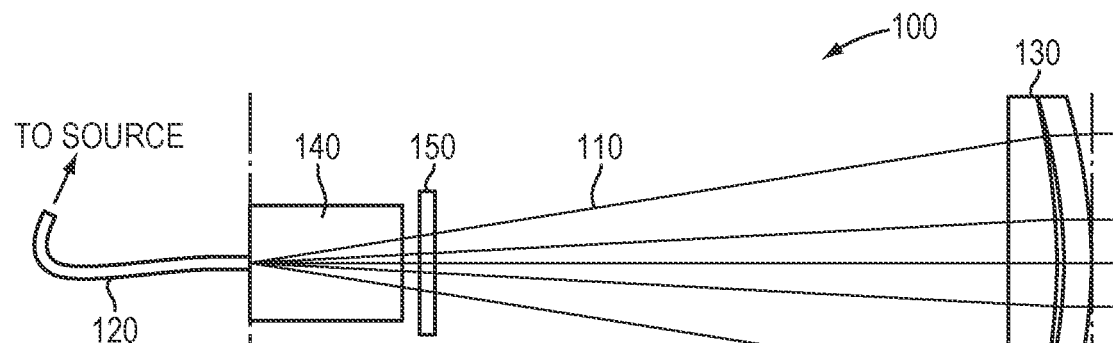
FIG. 1A is a schematic view of a portion of a laser delivery system.

FIG. 1A schematically depicts various components of a high-power laser delivery system 100. In FIG. 1A, a laser beam 110 is delivered from a beam source (not shown) by an optical fiber 120 and collimated by a collimator 130 of a laser head 30 (the remaining components, including one or more focusing lenses optically downstream of collimator 130, are not shown). In the arrangement of FIG. 1A, the collimator 130 may be, for example, a common doublet lens of 100 mm focal length. As shown, the fiber 120 terminates in an end cap 140, which is, for example, a 20 mm glass block typically composed of quartz or fused silica. The high-power delivery fiber system 100 may also include a protective window 150, which has no optical power, to protect the expensive fiber/end cap assembly. In various embodiments, the window 150, if present, and those components optically upstream thereof (e.g., end cap 140 and fiber 120) are portions of a fiber cable that connects to the laser head via conventional optical connectors known to those of skill in the art.

Figure 1B:
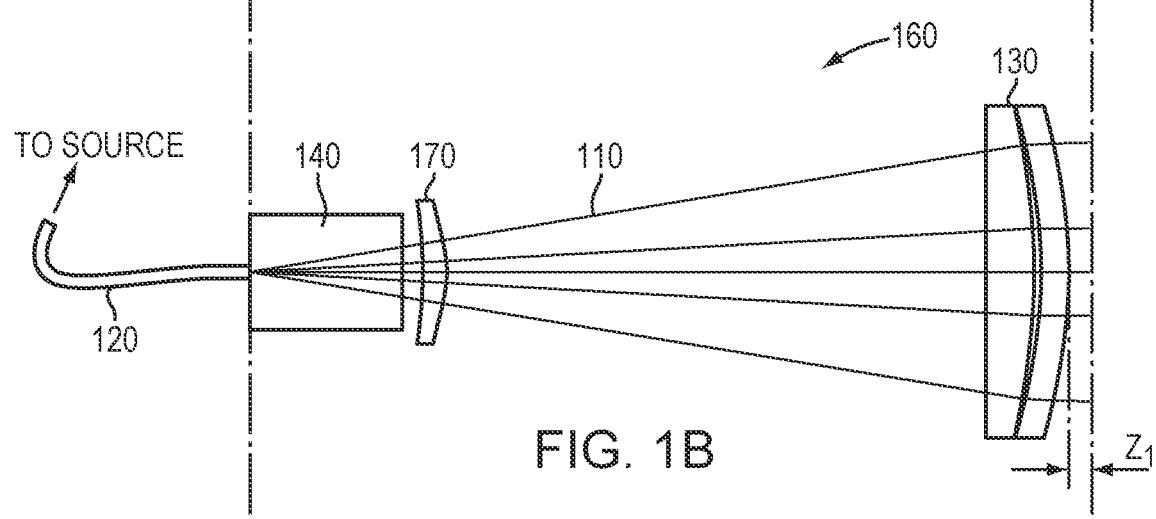
FIGS. 1B and 1C are schematic views of portions of laser delivery systems in accordance with embodiments of the invention.

FIG. 1B schematically depicts various components of a high-power laser delivery system 160 in accordance with embodiments of the present invention. As shown, a lens 170 has replaced the protective window 150 of system 100. In various embodiments, the lens 170 is placed as close as possible to the end cap 140; for example, the minimum gap between the lens 170 and the end cap 140 may range from approximately 0.5 mm to approximately 5 mm. The gap between the lens 170 and the end cap 140 may be considered when selecting the focal length of the lens 170 desired to achieve a particular reduction of NA, as detailed herein.

In accordance with embodiments of the invention, the lens 170 reduces the NA of the laser beam 110 (i.e., the lens 170 has positive optical power). In cases in which the laser beam 110 originally has an NA (or a maximum NA, in systems in which the NA of the laser may be altered) too large to be handled by collimator 130 without risk of damage to the laser head, the lens 170 enables the laser head and its components (e.g., the collimator 130) to be utilized without replacement thereof. The lens 170 has an optical power (i.e., the reciprocal of the focal length) sufficient to reduce the NA of the laser beam 110 (or the maximum NA, if the laser beam 110 may have a range of NAs) to a level less than the NA of the collimator 130. In a non-limiting numerical example, the lens 170 may reduce the NA of the laser beam 110 from fiber 120 by 25%, which is equivalent to replacing collimator 130 with a collimator having a focal length 35% shorter than that of collimator 130. In various embodiments, the lens 170 is a positive lens having a center thickness sufficiently large to maintain the minimum edge thickness for rigid mounting. The lens 170 may therefore be considered to be a "thin lens." For example, the center thickness of the lens 170 may be greater than approximately 0.5 mm or greater than approximately 1 mm, but also less than approximately 5 mm, less than approximately 4 mm, or even less than approximately 3 mm. The center thickness of lens 170 may depend on the lens diameter and surface radius of curvature. For positive single lenses having small diameters (e.g., less than 12 mm), typical edge thicknesses may range from approximately 1.8 mm to approximately 2.5 mm.

As shown in FIG. 1B, the collimator 130 may be moved (e.g., within the laser head) closer to the fiber exit surface 180 by a distance $Z_1$ to compensate for the presence of the lens 170, i.e., to focus the laser beam 110 to its smallest point. In various embodiments, the movement of the collimator 130 along (e.g., parallel to) the beam-propagation direction of laser beam 110 enables selection of the NA of the laser beam 110 (e.g., at a workpiece surface) and concomitant alteration of the spot size of the laser beam 110.

Figure 1C:
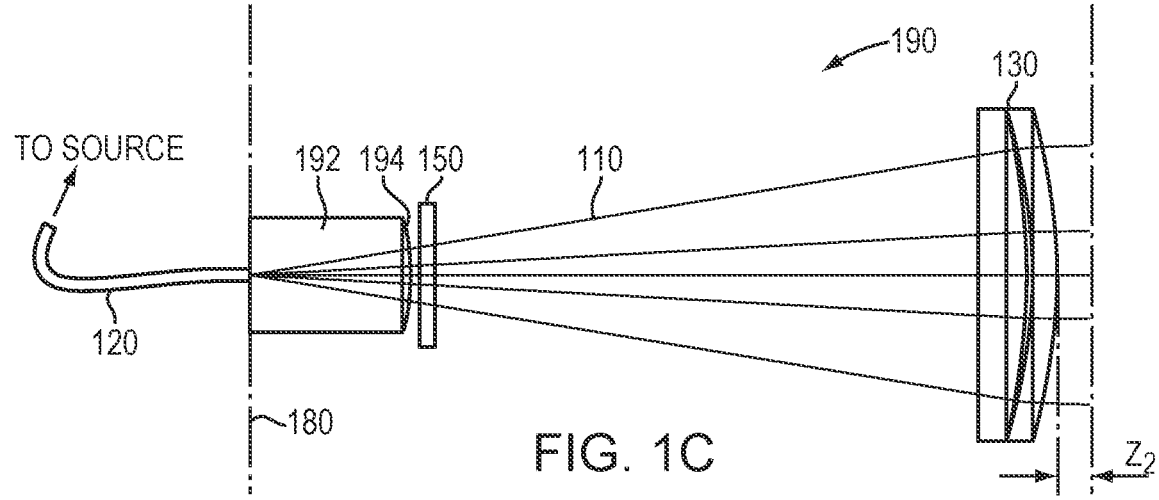

FIG. 1C schematically depicts various components of a high-power laser delivery system 190 in accordance with additional embodiments of the present invention. As shown, the protective end cap 140 has been replaced with a lensed glass block (or "lensed end cap") 192 having a curved output surface 194 having positive optical power. Similar to the addition of lens 170 in system 160 of FIG. 1B, the lensed glass block 192 will reduce the NA of the laser beam 110 from fiber 120. The lensed glass block 192 has an optical power (i.e., the reciprocal of the focal length) sufficient to reduce the NA of the laser beam 110 (or the maximum NA, if the laser beam 110 may have a range of NAs) to a level less than the NA of the collimator 130. The lensed glass block 192 may have a thickness approximately the same as that of conventional end cap 140, e.g., ranging from approximately 5 mm to approximately 30 mm (for example, 14 mm, 20 mm or ranging from 14 mm to 20 mm). As in system 160 of FIG. 1B, the collimator 130 may be moved (e.g., within the laser head) closer to the fiber exit surface 180 by a distance $Z_2$ to compensate for the use of the lensed glass block 192. As mentioned above in relation to FIG. 1B, the movement of the collimator 130 along (e.g., parallel to) the beam-propagation direction of laser beam 110 enables selection of the NA of the laser beam 110 (e.g., at a workpiece surface) and concomitant alteration of the spot size of the laser beam 110. As also shown in FIG. 1C, the lensed glass block 192 may optionally be utilized with the protective window 150 that has no substantial impact on the NA of the laser beam 110.

Figure 2:
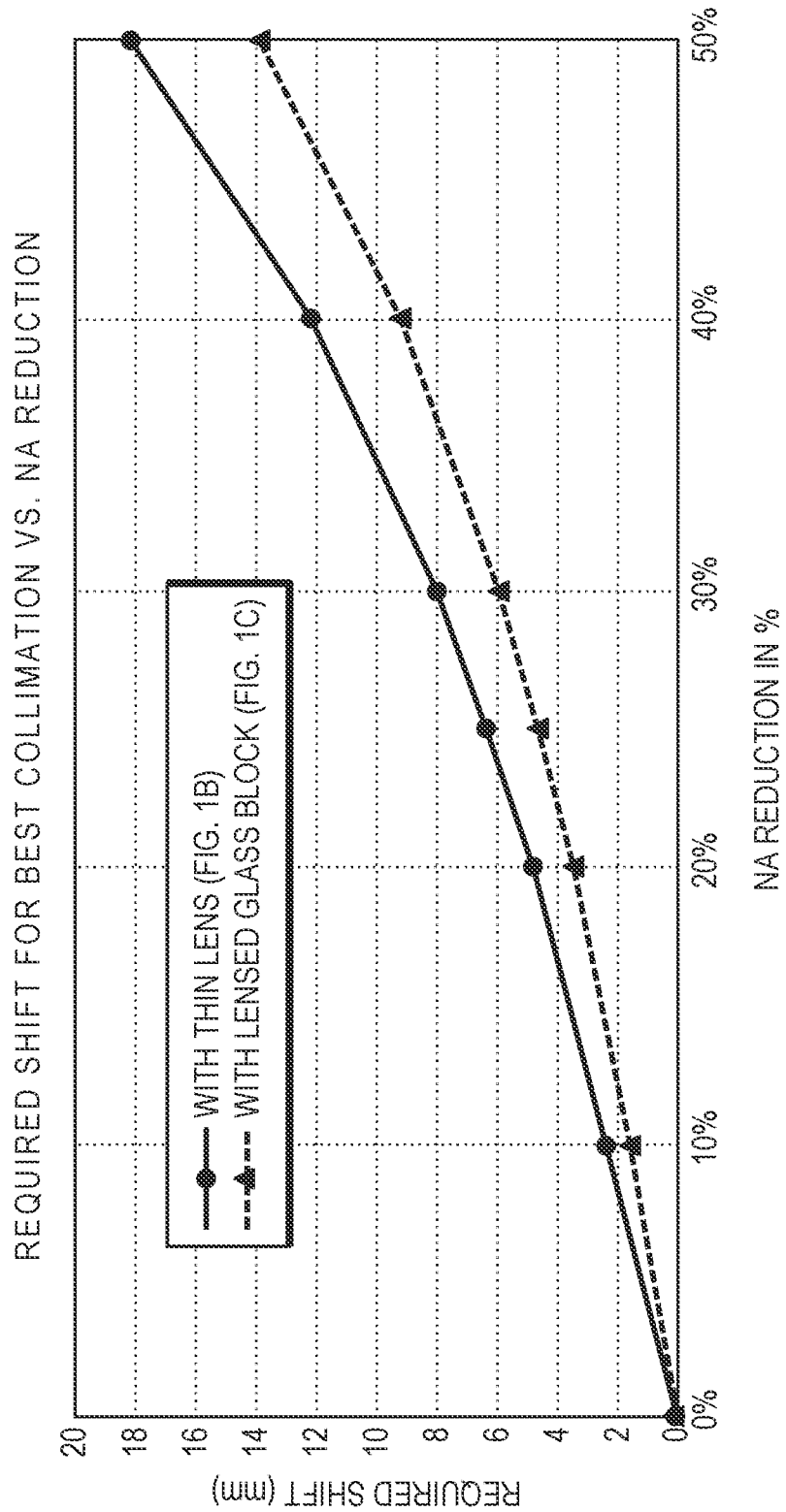
FIG. 2 is a graph of example collimator shifts utilized to compensate for NA reduction in laser delivery systems in accordance with embodiments of the invention.

FIG. 2 graphically depicts a set of exemplary shifts ($Z_1$ and $Z_2$) of the collimator 130 as a function of the NA reduction resulting from the addition of a lens 170 and the addition of a lensed glass block 192. The calculations of FIG. 2 assume that the collimator 130 has focal length of 100 mm, and the radius of curvature of the thin lens 170 and the lensed glass block 192 are re-optimized for each data point. As shown in FIG. 2, for the same NA reduction, the use of a lensed glass block 192 will require noticeably less shift (dashed line) than using a separate thin lens (solid line). In various embodiments, the larger shift required for lens 170 results from the larger distance between lens 170 and the fiber exit surface 180 than the integrated lens portion of the lensed glass block 192, assuming that the end cap used with lens 170 has approximately the same thickness as the non-lensed portion of glass block 192 (i.e., the portion corresponding to an end cap).

Figure 3:
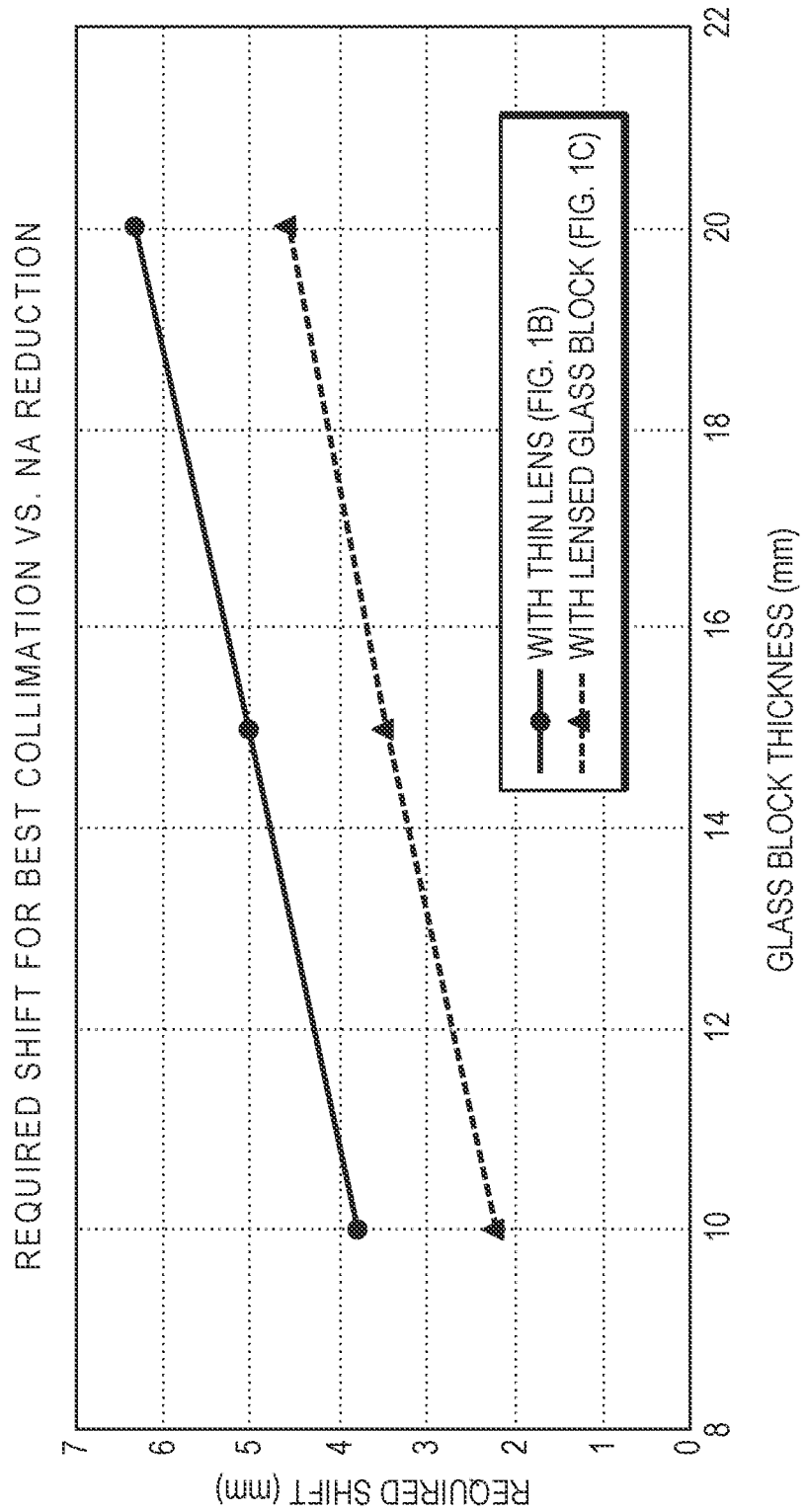
FIG. 3 is a graph of example collimator shifts utilized to compensate for end cap or lensed glass block thickness in laser delivery systems in accordance with embodiments of the invention.

FIG. 3 graphically depicts a set of exemplary shifts ($Z_1$ and $Z_2$) of the collimator 130 as a function of the thickness of the end cap 140 or lensed glass block 192 used in FIGS. 1B and 1C. As for FIG. 2, the calculations of FIG. 3 assume that the collimator 130 has focal length of 100 mm, and the radius of curvature of the thin lens 170 and the lensed glass block 192 are re-optimized for each data point. As shown, smaller shifts are required as the thickness of the end cap 140 or lensed glass block 192 decreases, as the lens 170 or the lensed portion of glass block 192 may be located closer to the fiber exit surface 180.

While FIGS. 1B and 1C demonstrate that the NA of the laser beam 110 may be reduced via the use of lens 170 or lensed glass block 192, in various embodiments the use of such elements may require the concomitant shift of the collimator 130 (to compensate for the NA reduction, i.e., to restore the collimation perturbed or diminished by the NA reduction) that exceeds the adjustable position range of collimator 130 within the laser head. For example, the required shift may consume a large portion (or substantially all), or even exceed, the adjustable range of a z-adjustable collimator 130, which is typically designed to vary the working distance of the laser head. Moreover, standard glass end caps typically have flat output surfaces and have thicknesses of, e.g., 14 mm to 20 mm. Thus, use of a lensed glass block 192 may require undesirable customization or even incompatibility with other components in the laser system. For example, the lensed glass block 192 may be fused onto the optical fiber 120, thereby confining use of a particular fiber 120 to devices in which a particular NA reduction is desired.

Figure 4A:
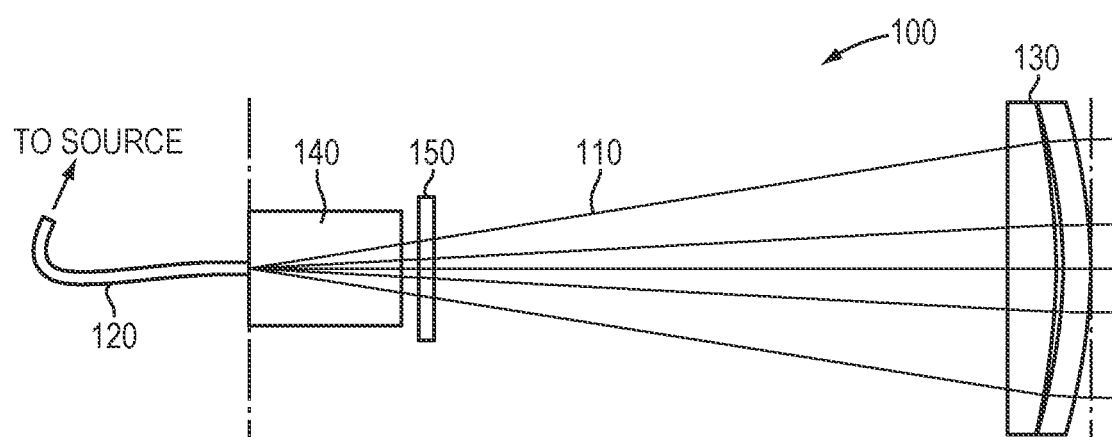
FIG. 4A is a schematic view of a portion of a laser delivery system.
Figure 4B:
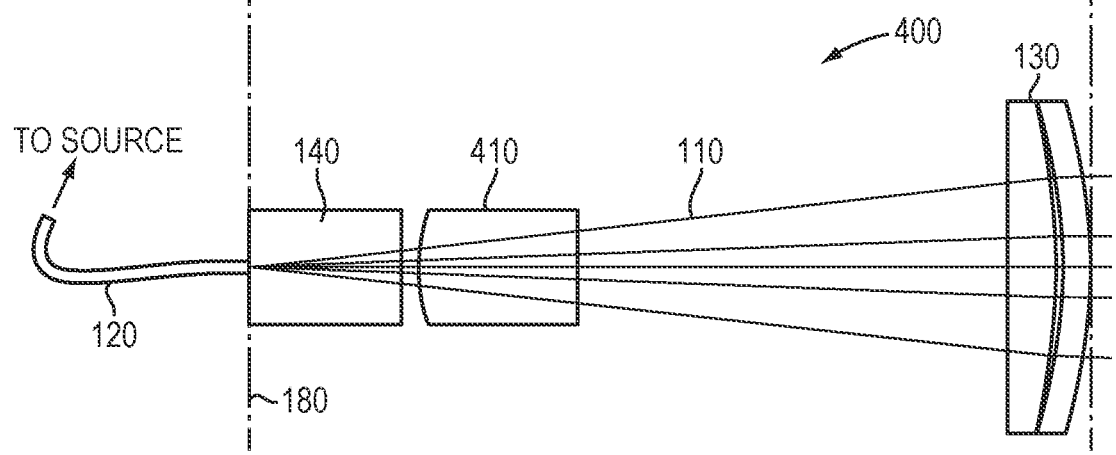
FIG. 4B is a schematic view of a portion of a laser delivery system in accordance with embodiments of the invention.

Various embodiments of the present invention address the possible issues raised above. FIG. 4A depicts the same components as system 100 of FIG. 1A for comparative purposes. FIG. 4B schematically depicts various components of a high-power laser delivery system 400 in accordance with embodiments of the present invention. As shown, the thin lens 170 utilized in system 160 of FIG. 1B has been replaced by a thick lens 410 that minimizes or substantially eliminates the shift of collimator 130 required for optimal collimation of laser beam 110. The thick lens 410 may have a center thickness greater than 5 mm, or even greater than 10 mm, in order to minimize or substantially eliminate the need for shifting the collimator 130. In various embodiments of the invention, the center thickness of the thick lens 410 may be less than approximately 25 mm. As also shown in FIG. 4B, the thick lens 410 may replace the protective window 150 featured in FIG. 4A. The thick lens 410 has an optical power (i.e., the reciprocal of the focal length) sufficient to reduce the NA of the laser beam 110 (or the maximum NA, if the laser beam 110 may have a range of NAs) to a level less than the NA of the collimator 130. As a non-limiting numerical example, FIG. 4B depicts a thick lens 410 having a center thickness of 12.5 mm for 25% NA reduction of laser beam 110, utilized with collimator 130 having a focal length of 100 mm and an endcap 140 having a thickness of 20 mm. Due to the thickness of the thick lens 410, substantially no shift of collimator 130 is required, nor is any alteration of the fiber endcap 140. In various embodiments of the invention, and as described in more detail below, the thick lens 410 may be replaced by a thinner lens (e.g., lens 170) and a flat glass block having substantially no optical power (e.g., a glass block having substantially flat input and output surfaces).

Figure 5:
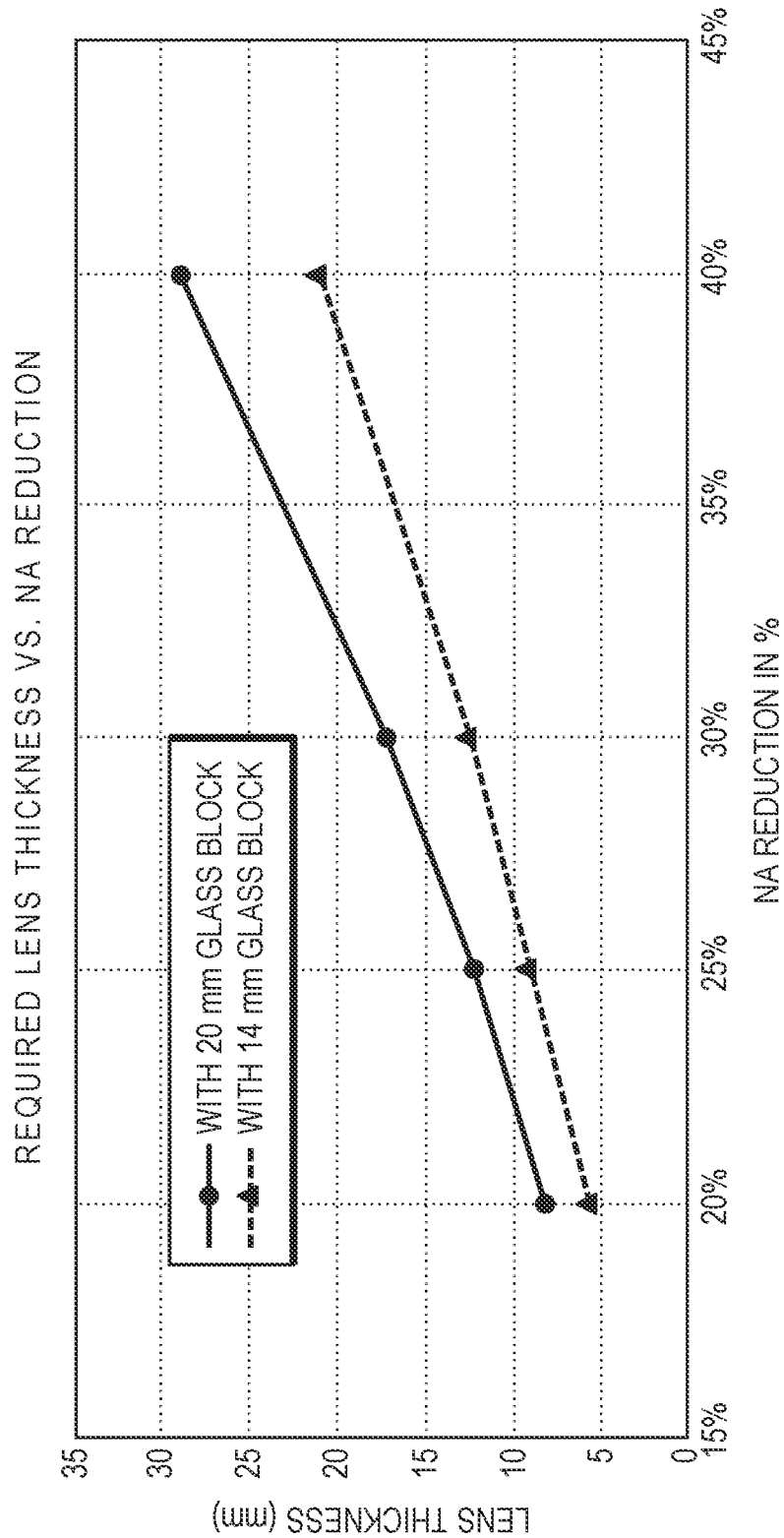
FIG. 5 is a graph of example center lens thickness utilized to compensate for NA reduction, without corresponding collimator shifts, in laser delivery systems in accordance with embodiments of the invention.

FIG. 5 graphically depicts the center thickness of a thick lens 410, as a function of desired NA reduction of the laser beam 110, required to substantially eliminate the need to shift collimator 130 in the embodiment shown in FIG. 4B using an end cap 140 having a thickness of either 14 mm or 20 mm. In FIG. 5, the collimator 130 is assumed to have a focal length of 100 mm. As shown, the required lens thickness increases as a function of NA reduction, but less so than for the thinner end cap 140.

In example embodiments of the invention described above, the lens 170, lensed end cap 192, and thick lens 410 each have a positive optical power (i.e., they are converging optical elements) in order to reduce the NA of the laser beam 110. In other embodiments, equivalent optical elements having negative optical power (i.e., diverging optical elements) may be utilized to increase the NA of the laser beam. For example, in systems in which the laser head is configured to accept a laser beam having a larger NA than the input laser beam, such embodiments may increase the NA of the laser beam before it is propagated to the laser head. Advantageously, such a laser beam will be experienced by the laser head and any downstream optics as if the beam were emitted from an optical fiber having a smaller core diameter; thus, the laser focal spot from the laser head focused on the workpiece may be reduced in size by approximately the same percentage as the NA increase enabled by the diverging optical element.

Figure 6A:
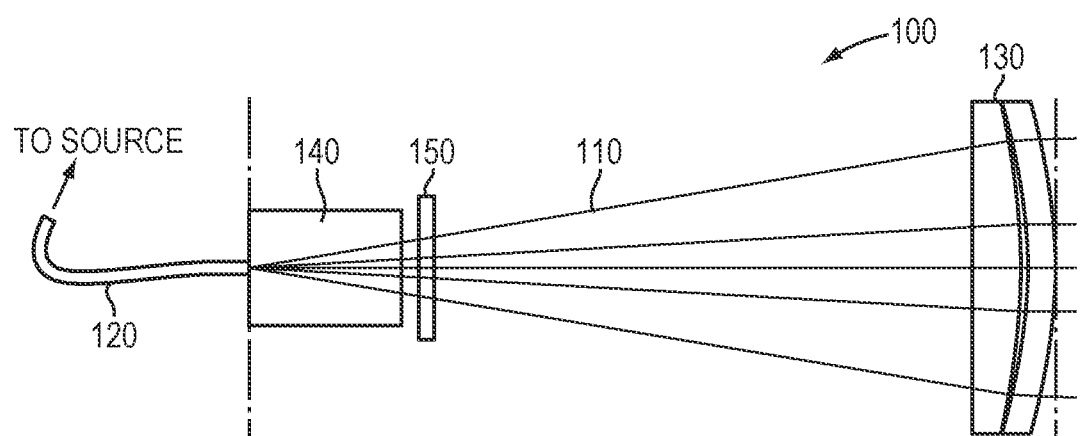
FIG. 6A is a schematic view of a portion of a laser delivery system.
Figure 6B:
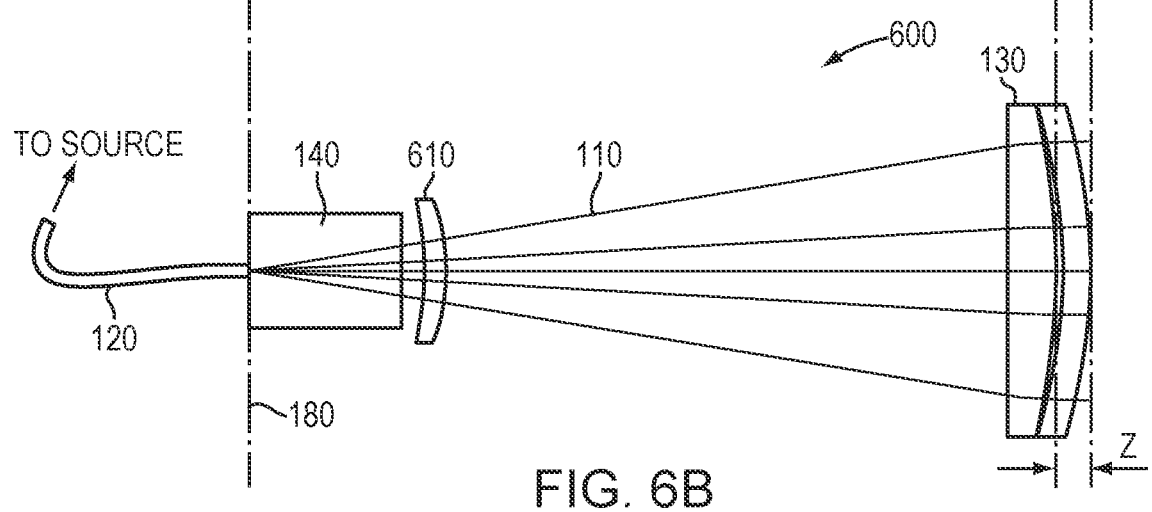
FIG. 6B is a schematic view of a portion of a laser delivery system in accordance with embodiments of the invention.

FIG. 6A depicts the same components as system 100 of FIG. 1A for comparative purposes. FIG. 6B schematically depicts various components of a high-power laser delivery system 600 in accordance with embodiments of the present invention. As shown, a negative lens 610 has replaced the lens 170 of system 160 of FIG. 1B. In accordance with embodiments of the invention, the lens 610 increases the NA of the laser beam 110. As shown in FIG. 6B, the collimator 130 may be moved (e.g., within the laser head) farther from the fiber exit surface 180 by a distance Z to compensate for the presence of the lens 610. In various embodiments, the lens 610 has an optical power (i.e., the reciprocal of the focal length) sufficient to increase the NA of the laser beam 110 (or the maximum NA, if the laser beam 110 may have a range of NAs) to a level less than or equal to the NA of the collimator 130.

Figure 7A:
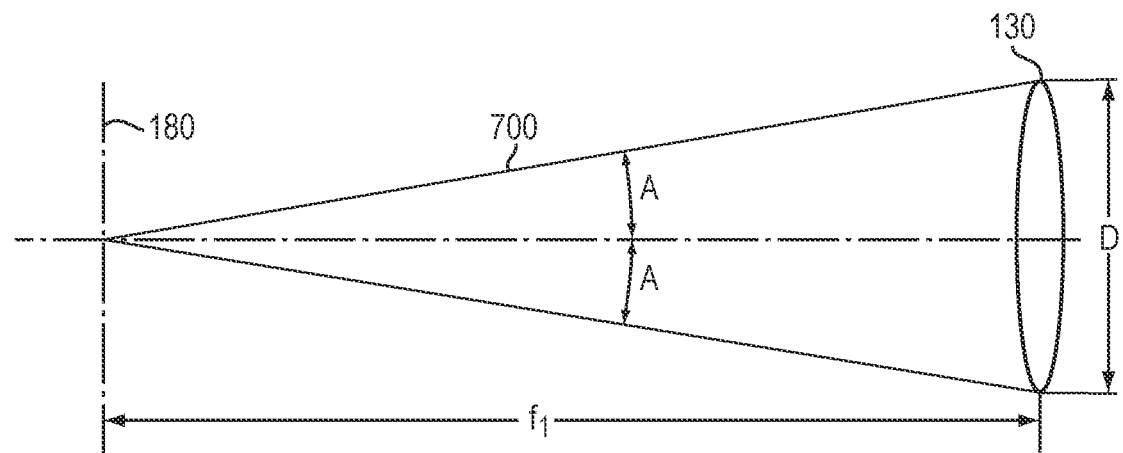
FIG. 7A is an optical schematic of a portion of a laser delivery system.

The relationships between the various optical elements depicted in FIGS. 1A-1C and 4B may be described mathematically. FIG. 7A is an optical schematic corresponding to the arrangement of system 100 of FIG. 1A, including both the fiber end surface 180 and the collimator 130. In FIG. 7A, a laser beam 700 exiting the optical fiber at the end surface 180 and having a maximum half-angle A (i.e., maximum NA=sin(A)≈A) is collimated by the collimator 130 having a focal length $f_1$. This results in a collimated beam size of $D = 2A \times f_1$.

Figure 7B:
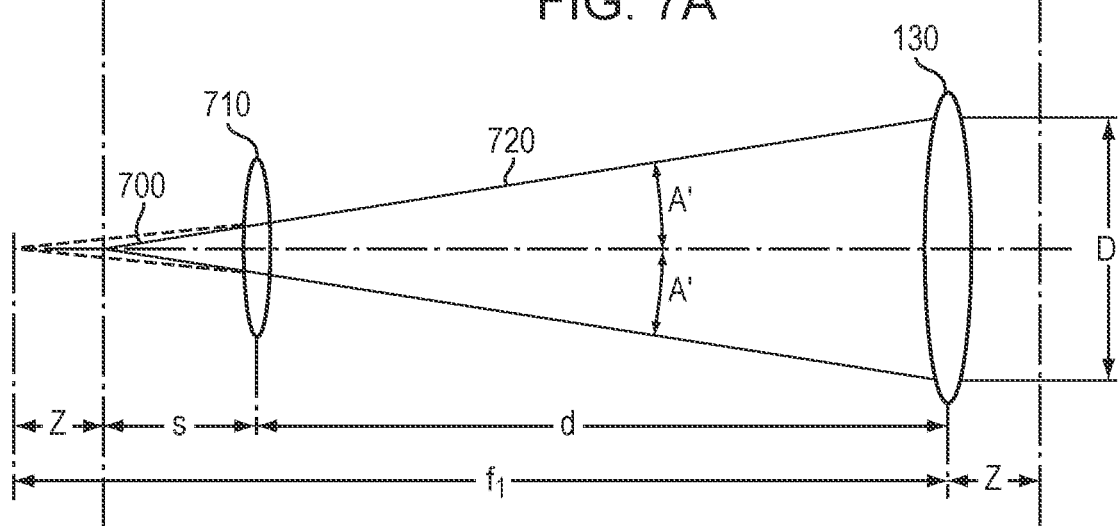
FIGS. 7B and 7C are optical schematics of portions of laser delivery systems in accordance with embodiments of the invention.

FIG. 7B adds a NA-reducing lens 710 having a focal length $f_2$ to the arrangement of FIG. 7A. The addition of lens 710 results in a laser beam 720 having an NA reduced by a factor of $R = A/A' = D/D' = f_1/EFL$. EFL is the effective focal length of the lens system shown in FIG. 7B and may be calculated by:

$$\frac{1}{EFL} = \frac{1}{f_1} + \frac{1}{f_2} - \frac{d}{(f_1 \times f_2)}$$

where d is the separation distance between the collimator 130 and the lens 710. The following lens imaging equation applies to lens 710:

$$\frac{1}{s} - \frac{1}{(s+Z)} = \frac{1}{f_2}$$

where Z is the shift of the collimator 130 required to compensate for the effective focal 10 length reduction after the addition of lens 710. From the above equations and the relationships $(s+Z)=(f_1-d)$ and $R=f_1/EFL$, the following relationship is obtained:

$$Z = s(R-1)$$

which indicates that, for a fixed effective optical distance s between the lens 710 and the fiber exit 180, a larger shift Z is required to compensate as the NA reduction R increases. This relationship also indicates that, for a fixed NA reduction R, a smaller collimator shift Z is required as the gap s between the lens 710 and the fiber exit 180 decreases. This confirms the discussion above with respect to FIG. 1C that the collimator shift needed when utilizing a lensed glass block 192 is smaller than when utilizing a separate thin lens 170, as in system 160 of FIG. 1B. As confirmed by FIG. 3, the required collimator shift also decreases as the thickness of the glass block 140 or 192 decreases.

Note that the effective optical distance s between the lens 710 and the fiber exit 180 may correspond to the physical optical distance therebetween, but this is not necessarily the case. For example, in embodiments in which end cap 140 is present downstream of the fiber exit 180 and upstream of the lens 170, the effective optical distance s will be given by:

$$s = \frac{t_1}{n_1} + (T - t_1)$$

where $t_1$ and $n_1$ are the thickness and refractive index of the end cap 140, respectively, T is the physical optical distance between the fiber exit 180 and the lens 170, and therefore $(T-t_1)$ is the air gap between the end cap 140 and the lens 170. In various embodiments, the air gap between the end cap 140 and the lens 170 is selected to be as small as possible in order to reduce the required translation distance for the collimator 130; thus, in various embodiments, T is approximately equal to $t_1$ and s is approximately equal to $t_1/n_1$.

Figure 7C:
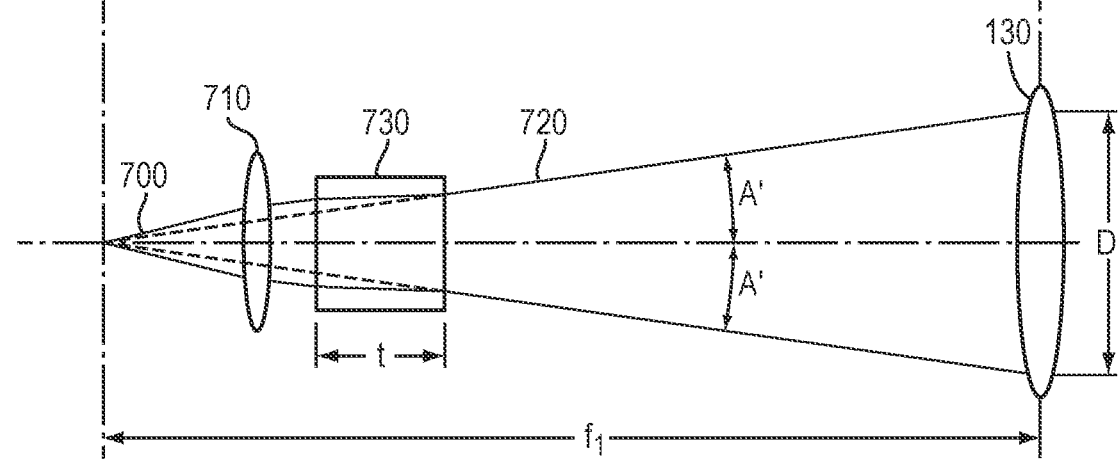

FIG. 7C schematically depicts an embodiment of the invention in which the required collimator shift Z may be reduced (e.g., to zero) via insertion of a flat glass block 730. The addition of the glass block 730 extends the focal point of lens 710 by a distance of $Z'=t(n-1)/n$, where n is the refractive index of the block 730 and t is the thickness of the block 730. This Z' may be selected to be approximately equal to the collimator shift Z required due to use of lens 710, thereby compensating for the collimator shift Z and obviating the need to move the collimator 130. Embodiments of the invention in accordance with FIG. 4B are an application of the embodiment of FIG. 7C, as the thick lens 410 may be considered to be a combination of lens 710 and the glass block 730 depicted in FIG. 7C.

Figure 8:
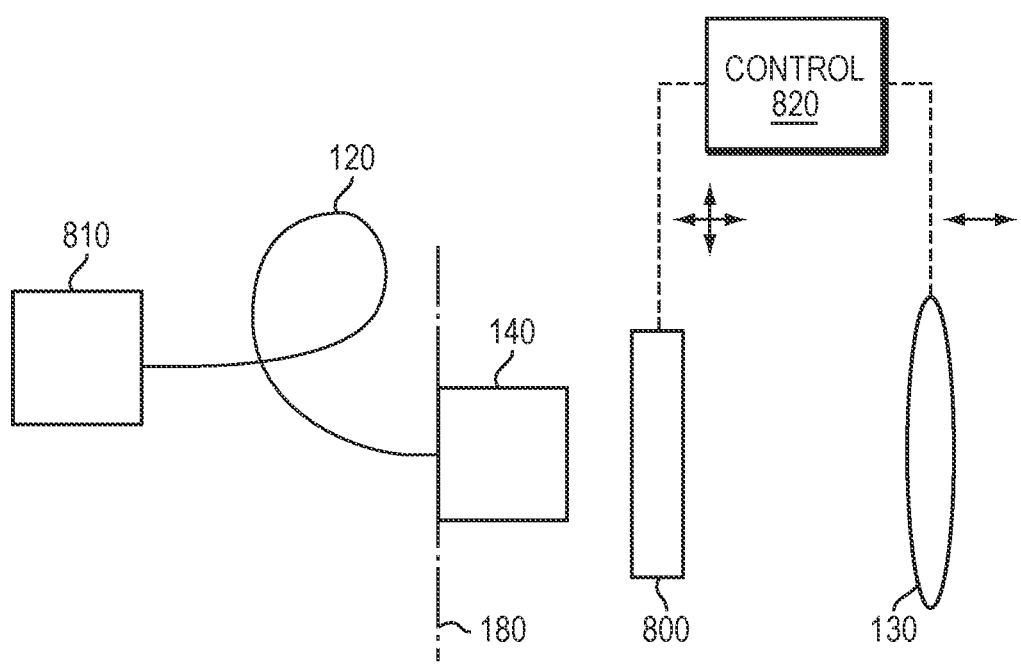
FIG. 8 is a schematic view of a portion of a laser delivery system in accordance with embodiments of the invention.

As shown in FIG. 8, the positions of the collimator 130 may be translated within the laser delivery head via use of a lens manipulation system that may include or consist essentially of, for example, one or more mechanized or motorized translation stages capable of motion along one, two, or three axes. In various embodiments, the lens manipulation system may also control the position of optical element 800 (which may include, consist essentially of, or consist of, for example, lens 170, lensed block 192 (in which case end cap 140 may not be present), lens 610, and/or lens 410, as well as one or more optional flat glass blocks), e.g., whether or not the optical element 800 is within the propagation path of the laser beam (emitted by source 810) and/or to adjust the distance between the optical element 800 and the fiber exit plane 180. The lens manipulation system may also be configured to move one or more different flat glass blocks within the propagation path of the beam (e.g., see block 730 in FIG. 7C) in order to increase the effective range of travel of collimator 130 within the laser head. That is, one or more flat glass blocks having different thicknesses may be movable into the beam propagation path, proximate the optical element 800, in order to at least partially compensate for the NA change resulting from the presence of optical element 800. As detailed above in relation to FIG. 7C, the presence of the flat glass block may reduce, or even eliminate, the amount of travel of collimator 130 necessary to account for the presence of optical element 800.

The lens manipulation system may be responsive to a controller 820. The controller 820 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described above. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as PYTHON, FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

In various embodiments, the movement of the collimator 130 within the laser head and/or the movement of optical element 800 alters the NA (and spot size, i.e., power density) of the output laser beam as detailed herein. The resulting output beam may be utilized for any of a host of different applications (e.g., cutting, welding, etc.). The laser beam 110 may be a multi-wavelength beam and may be generated by a WBC system, as described below; thus, in various embodiments the output beam is also a multi-wavelength beam. The laser head (e.g., collimator 130 and, optionally, one or more other optical elements such as focusing lenses) may direct the output beam to a workpiece for processing thereof.

The controller 820 may compute a proper position of the collimator 130 relative to the fiber exit 180 (and/or the presence or absence of a flat glass block, of a specific thickness, within the beam-propagation path) based on a desired value of a beam property (e.g., flux density, beam diameter, NA, etc.) at a workpiece or at the collimator 130 and a known relationship between the beam property and the position of the collimator 130 relative to the fiber exit 180; and/or based on user input (e.g., a commanded position of collimator 130); and/or, as explained in greater detail below, may use feedback so that the optimal position of the collimator 130 is progressively attained. For example, a photodetector or other light sensor may be utilized proximate the workpiece to monitor the beam shape, beam diameter, NA, and/or flux density at the workpiece surface (for example, the beam property of the beam itself, or via measurement of a reflection from the workpiece surface), and the controller 820 may utilize the measured value(s) as feedback to adjust the positioning of the collimator 130 relative to the fiber exit 180 until the desired beam property is achieved at the workpiece. For example, the measured beam property may be iteratively compared to a desired beam property (e.g., one input or otherwise determined by a user, and/or one determined by one or more properties of the workpiece and/or the type of processing for which the laser is to be utilized), and the controller 820 may reduce or minimize the difference therebetween via, e.g., minimization of an error function. Other sensors may be utilized in addition or instead of light sensors in embodiments of the invention, e.g., thermal sensors and/or sensors measuring the effect of the beam on the workpiece surface (e.g., depth or profile sensors, etc.).

In various embodiments, the position of the collimator 130 may be controlled to maintain the working distance between the laser head and the workpiece substantially unchanged while altering the NA of the laser beam via movement of the optical element 800. In such embodiments, the focal spot of the beam may therefore be adjusted while maintaining a constant working distance, which may be desirable for various applications in which different processes are performed on the same workpiece or in which one or more properties of the workpiece change as a function of position on the workpiece.

In various embodiments, the controller 820 may detect the beam shape, NA, spot size (or other beam property) resulting from various locations of collimator 130 (and/or presence or absence of a flat glass block proximate optical element 800) in combination with presence and/or changes in position of optical element 800, store the results, and utilize the results to determine one or more suitable locations in response to a desired beam property such as beam shape, spot size, or NA. The results may even be utilized in a machine-learning model that may be utilized to predict one or more beam properties resulting from locations of collimator 130 (and/or presence or absence of a flat glass block proximate optical element 800) in combination with presence and/or changes in position of optical element 800. In various embodiments, physical/optical modeling may be utilized to predict one or more beam properties (e.g., beam shape, spot size, and/or NA) resulting from various locations of collimator 130 (and/or presence or absence of a flat glass block proximate optical element 800) in combination with presence and/or changes in position of optical element 800, and such results may be utilized, at least in part, by controller 820 to select relative positions of the system elements to achieve a desired beam property.

The controller 820 may, in accordance with the embodiments of the invention, control the NA, spot size, and/or beam shape of the output beam based on the type of desired processing (e.g., cutting, welding, etc.) and/or on one or more characteristics (e.g., materials parameters, thickness, material type, etc.) of the workpiece to be processed and/or of a desired processing path mapped out for the output beam. Such process and/or material parameters may be selected by a user from a stored database in a memory associated with controller 820 or may be entered via an input device (e.g., touchscreen, keyboard, pointing device such as a computer mouse, etc.). One or more processing paths may be provided by a user and stored in an onboard or remote memory associated with controller 820. After workpiece and/or processing path selection, the controller 820 queries the database to obtain the corresponding parameter values. The stored values may include a spot size, NA, and/or beam shape suitable to the material and/or to one or more processing paths or processing locations on the material.

The controller 820 may, in some embodiments, receive feedback regarding the position and/or processing efficacy of the beam relative to the workpiece from a feedback unit connected to suitable monitoring sensors. In response to signals from the feedback unit, the controller 820 may alter the NA, spot size, and/or shape of the beam via, e.g., movement of the collimator 130 (and/or presence or absence of a flat glass block proximate optical element 800) and/or the optical element 800. Embodiments of the invention may also incorporate aspects of the apparatus and techniques disclosed in U.S. patent application Ser. No. 14/639,401, filed on Mar. 5, 2015, U.S. patent application Ser. No. 15/261,096, filed on Sep. 9, 2016, and U.S. patent application Ser. No. 15/649,841, filed on Jul. 14, 2017, the entire disclosure of each of which is incorporated by reference herein.

In addition, the laser system may incorporate one or more systems for detecting the thickness of the workpiece and/or heights of features thereon. For example, the laser system may incorporate systems (or components thereof) for interferometric depth measurement of the workpiece, as detailed in U.S. patent application Ser. No. 14/676,070, filed on Apr. 1, 2015, the entire disclosure of which is incorporated by reference herein. Such depth or thickness information may be utilized by the controller to control the output beam spot size, NA, and/or shape to optimize the processing (e.g., cutting or welding) of the workpiece, e.g., in accordance with records in the database corresponding to the type of material being processed.

Figure 9:
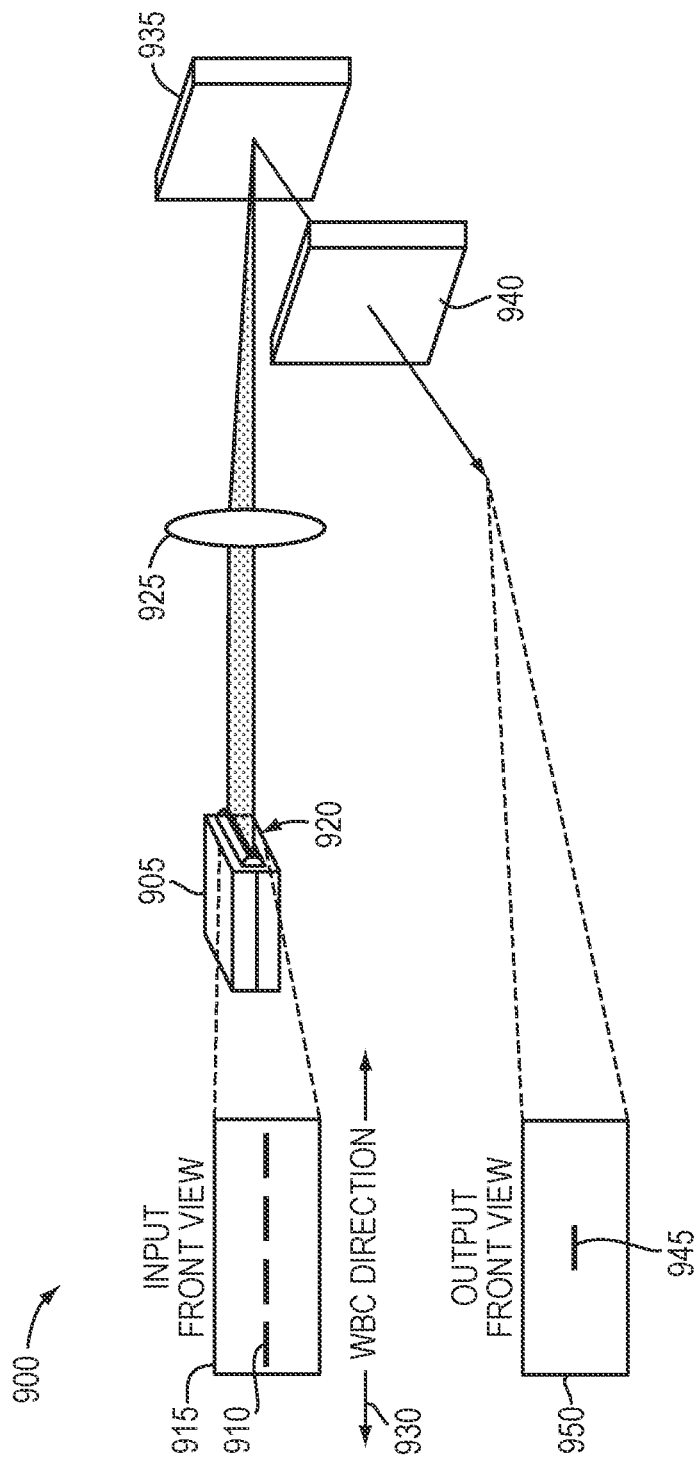
FIG. 9 is a schematic diagram of a wavelength beam combining laser system that may be utilized to supply the input beam for laser delivery systems in accordance with embodiments of the invention.

Laser systems and laser delivery systems in accordance with embodiments of the present invention and detailed herein may be utilized in and/or with WBC laser systems. Specifically, in various embodiments of the invention, multi-wavelength output beams of WBC laser systems may be utilized as the input beams for laser beam delivery systems as detailed herein. FIG. 9 depicts an exemplary WBC laser system 900 that utilizes one or more lasers 905. In the example of FIG. 9, laser 905 features a diode bar having four beam emitters emitting beams 910 (see magnified input view 915), but embodiments of the invention may utilize diode bars emitting any number of individual beams or two-dimensional arrays or stacks of diodes or diode bars. In view 915, each beam 910 is indicated by a line, where the length or longer dimension of the line represents the slow diverging dimension of the beam, and the height or shorter dimension represents the fast diverging dimension. A collimation optic 920 may be used to collimate each beam 910 along the fast dimension. Transform optic(s) 925, which may include, consist essentially of, or consist of one or more cylindrical or spherical lenses and/or mirrors, are used to combine each beam 910 along a WBC direction 930. The transform optics 925 then overlap the combined beam onto a dispersive element 935 (which may include, consist essentially of, or consist of, e.g., a reflective or transmissive diffraction grating, a dispersive prism, a grism (prism/grating), a transmission grating, or an Echelle grating), and the combined beam is then transmitted as single output profile onto an output coupler 940. The output coupler 940 then transmits the combined beams 945 as shown on the output front view 950. The output coupler 940 is typically partially reflective and acts as a common front facet for all the laser elements in this external cavity system 900. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 945 is a thus a multiple-wavelength beam (combining the wavelengths of the individual beams 910), and may be utilized as the input beam in laser beam delivery systems detailed herein and/or may be coupled into an optical fiber.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A laser delivery system for directing optical radiation onto a workpiece, the system comprising:
    an optical fiber configured to emit, at a fiber exit plane, a radiation beam having a numerical aperture ranging from a first numerical aperture to a second numerical aperture larger than the first numerical aperture;
    coupled to the optical fiber, a laser delivery head configured to receive the radiation beam and containing a collimator having a third numerical aperture less than the second numerical aperture; and
    disposed optically downstream of the fiber exit plane and optically upstream of the collimator, an optical element having positive optical power and configured to reduce the numerical aperture of the radiation beam to a value less than the third numerical aperture.

2. The system of claim 1, wherein the collimator is translatable, within the laser delivery head, in a direction parallel to a propagation path of the radiation beam within the laser delivery head.

3. The system of claim 1, wherein the laser delivery head comprises, disposed optically downstream of and distinct from the collimator, focusing optics for focusing the radiation beam onto the workpiece.

4. The system of claim 1, wherein the optical element comprises a lens having a center thickness greater than approximately 5 mm.

5. The system of claim 4, wherein an entrance surface of the lens is convexly curved, and an exit surface of the lens is flat.

6. The system of claim 4, wherein the center thickness is greater than approximately 10 mm.

7. The system of claim 1, wherein the optical element comprises (i) a lens and (ii) a transparent block having a flat entrance surface and a flat exit surface opposite the entrance surface.

8. The system of claim 1, further comprising a beam source for supplying the radiation beam to the optical fiber, the beam source comprising:
    one or more radiation sources emitting a plurality of discrete beams;
    focusing optics for focusing the plurality of beams onto a dispersive element;
    a dispersive element for receiving and dispersing the received focused beams; and
    a partially reflective output coupler positioned to receive the dispersed beams, transmit a portion of the dispersed beams therethrough as the radiation beam, and reflect a second portion of the dispersed beams back toward the dispersive element,
    wherein the radiation beam is composed of multiple wavelengths.

9. A laser delivery system for receiving and altering a numerical aperture of a radiation beam emitted by a beam source and focusing the radiation with the altered numerical aperture onto a workpiece, the system comprising:
    an optical fiber for transmitting the radiation beam from the beam source to a fiber exit plane;
    disposed at the fiber exit plane, an end cap for receiving the radiation beam from the optical fiber, the end cap having a flat entrance surface and a flat exit surface opposed to and spaced apart from the entrance surface;
    a lens distinct from and disposed optically downstream of the exit surface of the end cap, the lens having a positive optical power; and
    a laser delivery head positioned to receive the radiation beam, the laser delivery head comprising (i) a collimator for collimating the radiation beam, and (ii) disposed optically downstream of and distinct from the collimator, focusing optics for focusing the radiation beam onto the workpiece.

10. The system of claim 9, wherein a center thickness of the lens is greater than approximately 5 mm.

11. The system of claim 10, wherein an entrance surface of the lens is convexly curved, and an exit surface of the lens is flat.

12. The system of claim 10, wherein the center thickness is greater than approximately 10 mm.

13. The system of claim 9, wherein the beam source comprises:
    one or more radiation sources emitting a plurality of discrete beams;
    focusing optics for focusing the plurality of beams onto a dispersive element;
    a dispersive element for receiving and dispersing the received focused beams; and
    a partially reflective output coupler positioned to receive the dispersed beams, transmit a portion of the dispersed beams therethrough as the radiation beam, and reflect a second portion of the dispersed beams back toward the dispersive element,
    wherein the radiation beam is composed of multiple wavelengths.

14. A method of modifying a laser delivery system comprising (i) an optical fiber for transmitting a radiation beam emitted by a beam source to a fiber exit plane, and (ii) a laser delivery head for receiving the radiation beam from the optical fiber, the laser delivery head comprising a collimator for collimating the radiation beam, wherein (A) the laser delivery head is configured to accept a radiation beam having a numerical aperture no greater than a maximum numerical aperture, and (B) the beam source is configured to supply a radiation beam having a numerical aperture greater than the maximum numerical aperture, the method comprising:
    without replacing the collimator in the laser delivery head, disposing a lens optically downstream of the end cap, the lens (i) having a positive optical power, (ii)

having a center thickness larger than approximately 5 mm, and (iii) being configured to receive the radiation beam and reduce the numerical aperture thereof to a numerical aperture no greater than the maximum numerical aperture; and within the laser delivery head, maintaining an optical distance between the collimator and the fiber exit surface substantially unchanged notwithstanding the reduction of the numerical aperture of the radiation beam and the presence of the lens.

15. The method of claim 14, wherein an entrance surface of the lens is convexly curved, and an exit surface of the lens is flat.

16. The method of claim 14, wherein the center thickness is greater than approximately 10 mm.

17. The method of claim 14, wherein the laser delivery system comprises an end cap for receiving the radiation beam from the optical fiber at the fiber exit plane, the end cap having a flat entrance surface and, spaced apart from the entrance surface, a flat exit surface.

18. The method of claim 14, wherein the laser delivery head comprises, disposed optically downstream of the collimator, focusing optics for focusing the radiation beam onto a workpiece.

19. The method of claim 14, wherein the beam source comprises:

one or more radiation sources emitting a plurality of discrete beams;

focusing optics for focusing the plurality of beams onto a dispersive element;

a dispersive element for receiving and dispersing the received focused beams; and a partially reflective output coupler positioned to receive the dispersed beams, transmit a portion of the dispersed beams therethrough as the radiation beam, and reflect a second portion of the dispersed beams back toward the dispersive element, wherein the radiation beam is composed of multiple wavelengths.

* * * * *